United States Patent
Yang et al.

(10) Patent No.: US 7,365,001 B2
(45) Date of Patent: Apr. 29, 2008

(54) INTERCONNECT STRUCTURES AND METHODS OF MAKING THEREOF

(75) Inventors: Chih-Chao Yang, Beacon, NY (US);
Louis L. Hsu, Fishkill, NY (US); Keith Kwong Hon Wong, Wappingers Falls, NY (US); Timothy Joseph Dalton, Ridgefield, CT (US); Carl Radens, LaGrangeville, NY (US); Larry Clevenger, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 486 days.

(21) Appl. No.: 10/735,845

(22) Filed: Dec. 16, 2003

(65) Prior Publication Data

US 2005/0127511 A1 Jun. 16, 2005

(51) Int. Cl.
*H01L 21/4763* (2006.01)

(52) U.S. Cl. ............... 438/622; 438/629; 438/637; 438/638; 438/639; 257/774; 257/775; 257/700; 257/762; 257/758

(58) Field of Classification Search ............ 438/618, 438/637, 622, 652–653, 675, 689, 691, 693–694, 438/696, 699–700, 702–703, 667–668, 687, 438/640, 672, 701, 713, 978, 597, 614, 620, 438/627, 629, 643, 638–639; 257/758, 750–752, 257/774–775, 700, 762, E23.145
See application file for complete search history.

(56) References Cited

U.S. PATENT DOCUMENTS

| | | | |
|---|---|---|---|
| 5,098,860 A | | 5/1992 | Chakravorty et al. |
| 6,060,019 A | * | 5/2000 | Spencer et al. ............... 422/23 |
| 6,312,874 B1 | * | 11/2001 | Chan et al. .................. 430/314 |
| 6,607,977 B1 | | 8/2003 | Rozbicki et al. |
| 6,855,629 B2 | * | 2/2005 | Kim et al. ................... 438/637 |
| 2003/0104704 A1 | * | 6/2003 | Lee et al. .................... 438/710 |
| 2004/0004287 A1 | * | 1/2004 | Shimizu et al. ............. 257/758 |
| 2004/0152295 A1 | * | 8/2004 | Cooney et al. ............. 438/623 |
| 2004/0183203 A1 | * | 9/2004 | Meagley et al. ............ 257/774 |
| 2005/0118796 A1 | * | 6/2005 | Chiras et al. ............... 438/618 |

* cited by examiner

*Primary Examiner*—Thao Xuan Le
*Assistant Examiner*—Thanh Y. Tran
(74) *Attorney, Agent, or Firm*—Connolly Bove Lodge & Hutz LLP; Robert M. Trepp

(57) ABSTRACT

A method of making a diffusion barrier for a interconnect structure. The method comprises: providing a conductive line in a bottom dielectric trench; depositing a sacrificial liner on the cap layer; depositing an interlayer dielectric; forming a trench and a via in the top interlayer dielectric; and removing a portion of the cap layer and the sacrificial layer proximate to the bottom surface of the via. The removed portions of the cap layer and sacrificial layer deposit predominantly along the lower sidewalls of the via. The conductive line is in contact with a cap layer, and the sacrificial layer is in contact with the cap layer. The invention is also directed to the interconnect structures resulting from the inventive process.

16 Claims, 5 Drawing Sheets

INTERCONNECT STRUCTURES AND METHODS OF MAKING THEREOF

FIELD OF THE INVENTION

The invention is directed to interconnect structures used in semiconductor integrated circuit, and methods of making the structures. In particular, the invention is directed to interconnect structures with a sacrificial layer proximate to the conducting material in the structures, and the use of the sacrificial layer as a barrier layer.

BACKGROUND OF THE INVENTION

In semiconductor integrated circuit devices barrier layers are used to avoid atomic diffusion of various elements from one layer to another. For example, barrier layers are used in conjunction with conductive materials, such as those used as interconnect devices or wiring layers. The conductive materials are generally isolated from other features of semiconductor integrated circuit devices by a dielectric material.

In damascene processing, the interconnect structure or wiring pattern is formed within grooves or other openings formed within a dielectric film. Using known techniques a photoresist material is used to define the wiring pattern. The patterned photoresist acts as a mask through which a pattern of the dielectric material is removed by a subtractive etch process such as plasma etching or reactive ion etching. The etched openings are used to define wiring patterns in the dielectric layer. These wiring patterns can extend from one surface of the dielectric layer to the other surface of the dielectric layer. Alternatively, the wiring patterns can be confined to a single layer, that is, not extend to the opposite surface of the dielectric layer. The wiring patterns are then filled with a metal using a filling technique such as electroplating, electroless plating, chemical vapor deposition, physical vapor deposition or a combination thereof. Excess metal can then be removed by chemical mechanical polishing through a process known as planarization.

In the single damascene process, via openings are provided in the dielectric layer and filled with a conducting metal, which is often referred to as metallization, to provide electrical contact between layers of wiring levels. In the dual damascene process, the via openings and the wiring pattern openings are both provided in the dielectric layer before filling with the conducting metal. The dual damascene process can simplify the manufacturing process by eliminating some internal interfaces. Damascene processing followed by metallization is continued for each layer in the electronic component until the electronic device is completed.

Barrier layers are needed between the dielectric material and the conductive material in order to prevent atoms of the conductive material from diffusing into and at times through the dielectric material and into other active circuit device structures. Diffusion of conductive material in the device can cause inter-level or intra-level shorts through the dielectric material. Also, junction leakage may result, and threshold voltage ($V_t$) levels of the transistors formed within the substrate can shift. In some cases, device functionality can be destroyed.

Diffusion is a particular concern when a high diffusivity element is used as a conductive material in the semiconductor structures. For example, copper atoms often exhibit relatively high diffusion mobility in most dielectric materials.—Yet, in spite of this problem, copper is a favored material for interconnects because of its superior conductivity. As a result, if copper is used as an interconnect structures, the copper needs to be confined with a barrier layer.

Barrier layers used in many BEOL integration schemes are typically deposited by physical vapor deposition (PVD). FIGS. 1A to 1C are representational cross-sectional views of process steps taken to provide a copper interconnect of the prior art. With reference to FIG. 1A, a dual-damascene copper interconnect is represented, which includes trench 14 and via 15, copper line 12, cap layer 13 (e.g. silicon nitride, silicon carbide, or silicon oxide) and interlayer dielectric 11. As shown, via 15 is etched in the interlayer dielectric 11 and the cap layer 13 to expose copper line 12. A barrier layer 16 (e.g. tantalum, tantalum nitride) is deposited on the patterned interlayer dielectric 11 using a PVD process, as shown in FIG. 1B. FIG. 1B also depicts the poor or non-conformal coverage of the PVD deposited barrier layer 16 at the lower side walls near the bottom of the via 15, e.g., at site 17 as indicated. Typically, a copper seed layer (not shown) is then deposited over the barrier layer, followed by a Cu plating process to fill the features, i.e. 14 and 15, as shown in FIG. 1C.

U.S. Pat. No. 6,607,977 describes a process that address in-part the poor coverage observed with a PVD deposited barrier layer at the side walls near the bottom of the via. FIG. 2A is a cross-sectional view after depositing a PVD barrier 26 over a patterned dielectric 21. Again, there is poor or non-conformal coverage at site 27. A second deposition process is then used to simultaneously etch the barrier material 26 that deposited at the bottom of via 25 while at the same time deposit a second barrier material. This second deposition process is said to provide enhanced coverage at the lower side walls of the via, i.e. site 27, as shown in FIG. 2B. However, one disadvantage with such a process is that the amount of material that is etched and redeposited is limited by the amount of barrier material that originally deposited at the via bottom.

However, as the market demand continues for smaller and smaller circuit dimension, PVD's limitation in conformal step coverage is a problem that needs to be addressed. In a dual-damascene BEOL process scheme, a problem is the resulting poor barrier coverage at the bottom of via sidewalls. This in turn can degrade circuit reliability over time. A similar problem is observed in a BEOL single-damascene integration scheme when the wiring aspect ratio is greater than 5.

SUMMARY OF THE INVENTION

The invention is directed to a method of making an interconnect structure. The method comprises: providing a conductive line in a dielectric trench, wherein the conductive line is in contact with a cap layer; depositing a sacrificial layer on the cap layer; depositing an interlayer dielectric on the sacrificial layer; forming a trench and a via in the interlayer dielectric, wherein the via bottom extends to the sacrificial layer; and removing a portion of the cap layer and the sacrificial layer proximate to the bottom surface of the via, wherein the removed portions of the cap layer and sacrificial layer deposit predominantly along the lower sidewalls of the via.

The invention is also directed to an interconnect structure comprising: a conductive line in a dielectric trench, wherein the conductive line is in contact with a cap layer; a sacrificial layer on the cap layer; and an interlayer dielectric with a via provided over the copper line, wherein the lower sidewalls of the via contain removed portions of the sacrificial layer and cap layer.

BRIEF DESCRIPTION OF THE DRAWINGS

This invention will be better understood by reference to the Detailed Description of the Invention when taken together with the attached drawings, wherein.

DETAILED DESCRIPTION OF THE INVENTION

Figure 1A:
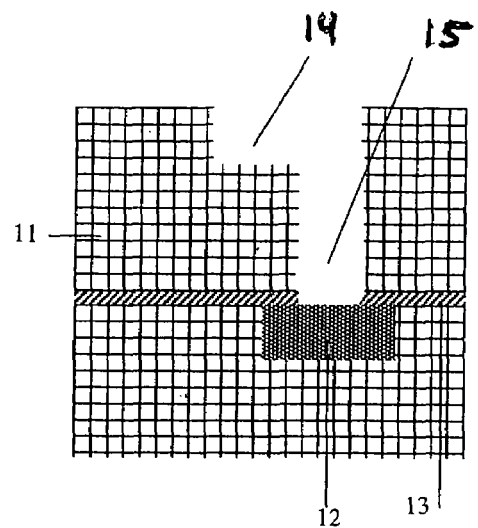
FIGS. 1A to 1C are representational cross-sectional views of process steps taken to provide a copper interconnect in the prior art.
Figure 1B:
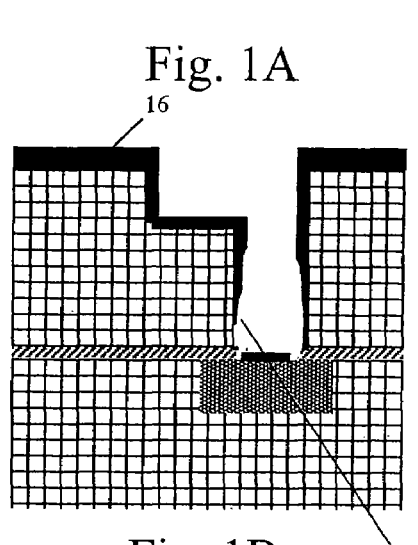
Figure 1C:
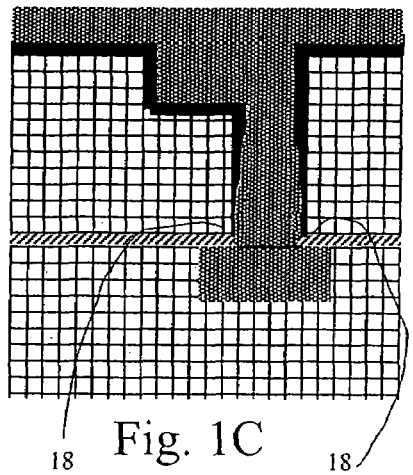
Figure 2B:
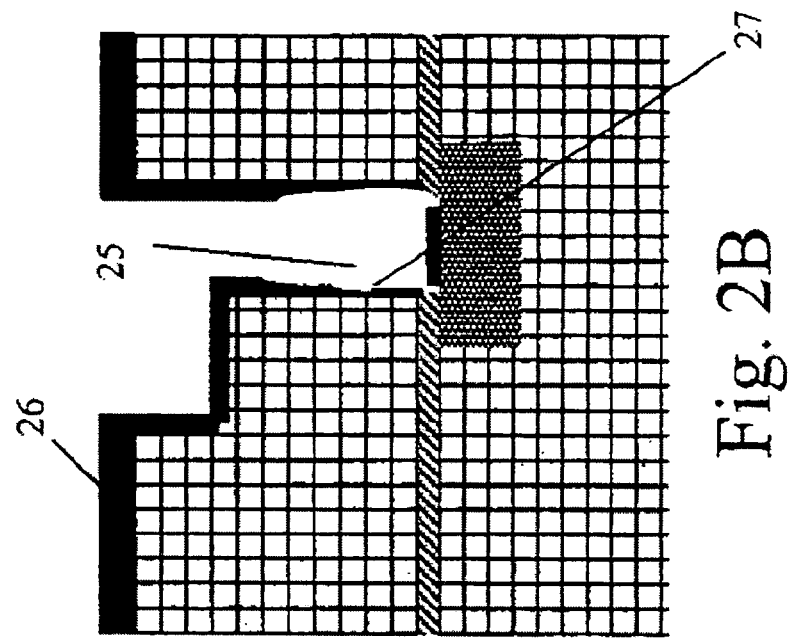
FIG. 2A and 2B are representational cross-sectional views of process steps described in the prior art.
Figure 2A:
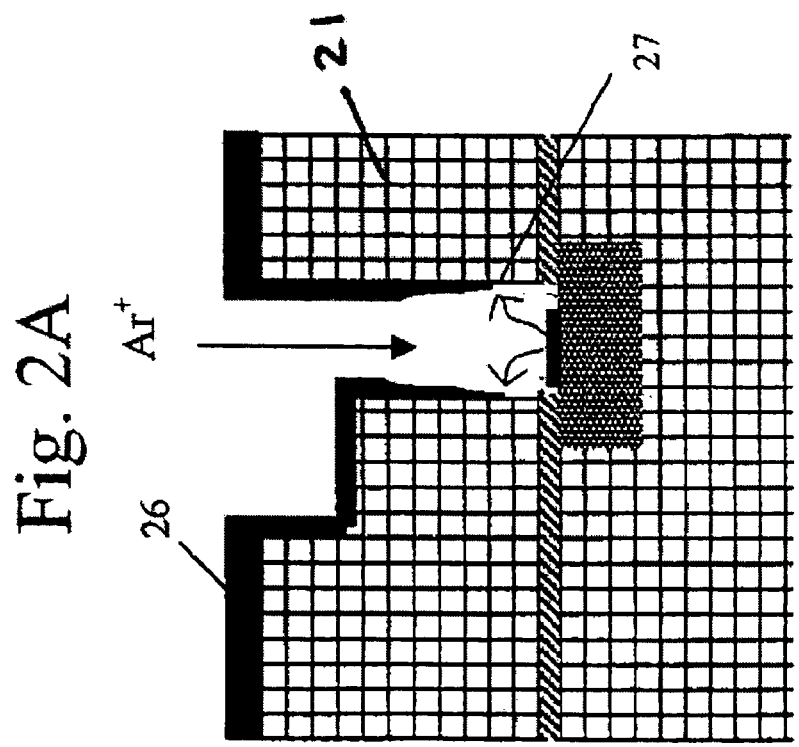

In a conventional interconnect structure as shown in FIG. 1C, the poor coverage of barrier material at site 18 will in most, if not all cases, lead to weak mechanical strength due to the essential thermal mismatch of the filled conductive material and dielectrics. This often results in a significant degrade in device reliability. The present invention addresses this faulty design feature by providing a sacrificial layer at the bottom of the via.

To address the problem of poor step coverage obtained with PVD barrier layers, Applicants developed a process that includes the deposition of a sacrificial layer in the process of making an interconnect structure. The sacrificial layer is then used as a source of material that is etched or resputtered, and redeposited on the sidewalls of the via proximate to the bottom surface of the via.

The method of the present invention comprises: providing a conductive line in a dielectric trench, wherein the conductive line is in contact with a cap layer; depositing a sacrificial liner on the cap layer; depositing an interlayer dielectric; forming a trench and a via in the interlayer dielectric, wherein the via bottom extends to the sacrificial layer; and removing a portion of the cap layer and the sacrificial layer proximate to the bottom surface of the via, wherein the removed portions of the cap layer and sacrificial layer deposit predominantly along the lower sidewalls of the via. The conductive line is selected from the group consisting of TaN, Ta, Ti, Ti(Si)N, Au, Ag, Ru, W, Cu, Al, and Al(Cu)x (Si)y.

The method can also include depositing a barrier layer on upper and lower sidewalls and bottom surface of the trench and via in the interlayer dielectric. The barrier layer can be deposited on the upper and lower sidewalls and bottom surface of the trench and via either before or after removing or resputtering a portion of the cap layer and the sacrificial layer. In either case improved coverage at the bottom sidewalls of the via is obtained. Of course, if the barrier layer is deposited before the resputtering process then a portion of the barrier layer will also be resputtered.

Removable or resputtering of a portion of the cap layer and the sacrificial layer can be conducted by gaseous ion bombardment. For example, the gas for sputter-etching is selected from the group consisting of Ar, He, Ne, Xe, $N_2$, $H_2$, $NH_3 N_2 H_2$ and mixtures thereof. It is to be understood, however, that any known method can be used to specifically resputter the deposited materials, e.g., the sacrificial layer, located at the bottom of the via.

Another resputtering process that can be used is described in U.S. Pat. No. 6,607,977, the entire disclosure of which is incorporated herein by reference. In this process, a second deposition process is used to simultaneously etch a previously deposited barrier material at the bottom of via while at the same time deposit a second barrier material. The described process is a plasma process with a relative selective deposition at the lower sidewall.

The method of making the interconnect structure of the present invention can also include depositing a metal liner or a seed layer in contact with the barrier layer and removed portions of the sacrificial layer. A conducting layer is then deposited on top of the metal liner or seed layer. The deposition of the conducting layer can proceed by electrochemical deposition such as electroplating or electroless plating. Examples of suitable copper electroplating compositions are disclosed in U.S. patent application Ser. No. 09/348,632, assigned to International Business Machines, the entire disclosure of which is incorporated herein by reference. Other materials such as aluminum, tungsten, gold, silver or an alloy thereof can also be used.

Figure 3A:
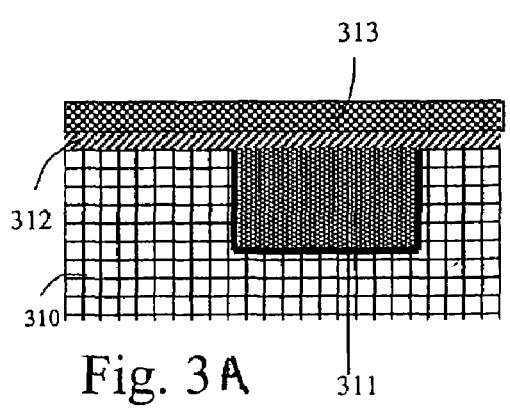
FIGS. 3A to 3E are representational cross-sectional views of process steps of one embodiment of the present invention.
Figure 3B:
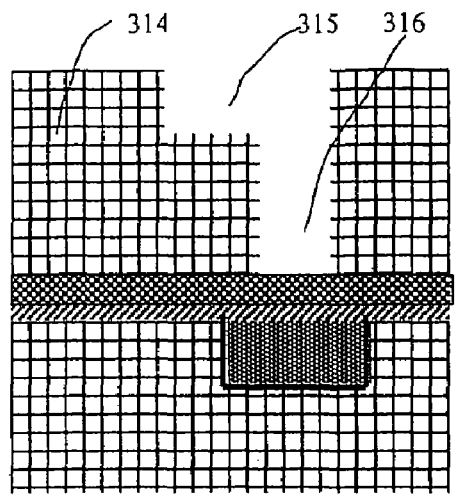
Figure 3C:
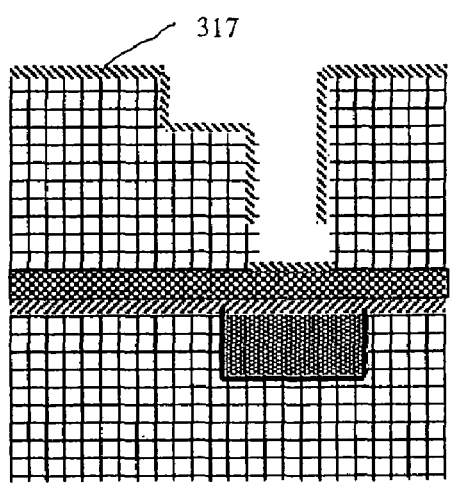
Figure 3D:
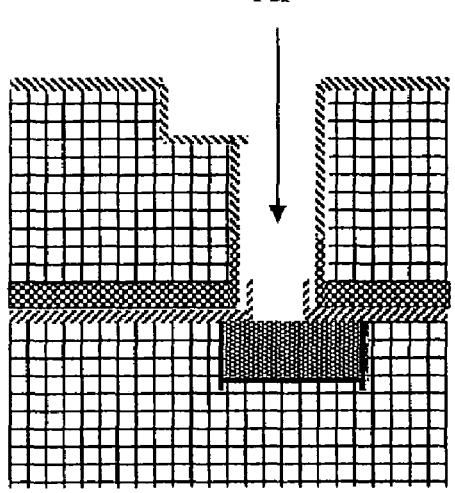
Figure 3E:
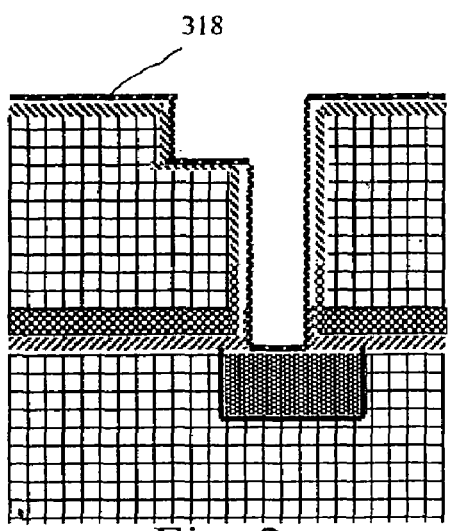

One embodiment of the method of the present invention is represented by FIGS. 3A to 3E. FIG. 3A depicts providing a conductive line 311 in a dielectric 310, a cap layer 312 and sacrificial layer 313. The interlayer dielectric 314 is deposited on sacrificial layer 313 and patterned to provide trench 315 and via 316 as shown in FIG. 3B. A barrier layer 317 is then deposited on the patterned interlayer dielectric as shown in FIG. 3C. As shown, there is poor or non-conformal coverage on the lower sidewalls proximate to the bottom of the via. A gaseous ion bombardment sputtering process is then used to etch or remove portions of barrier layer 317, sacrificial layer 313 and cap layer 312 at the bottom of via 316 as shown in FIG. 3D. Note that the re-sputtering of the sacrificial layer material onto the bottom of the side walls enhances the liner coverage at sites, which prior to the resputtering process, exhibited poor coverage of barrier layer 317. The method can also include the deposition of a metal liner or seed layer 318 prior to plating the copper conductive layer as shown in 3E.

Figure 4A:
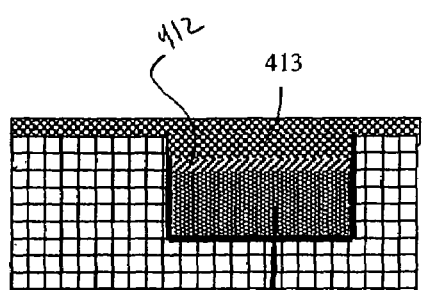
FIGS. 4A to 4E are representational cross-sectional views of process steps of another embodiment of the present invention.
Figure 4B:
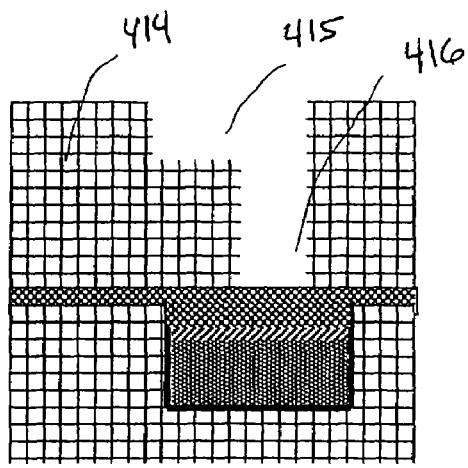
Figure 4C:
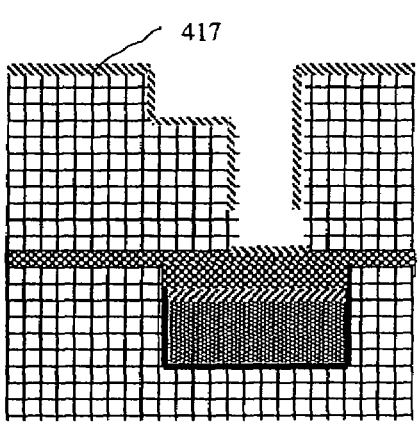
Figure 4D:
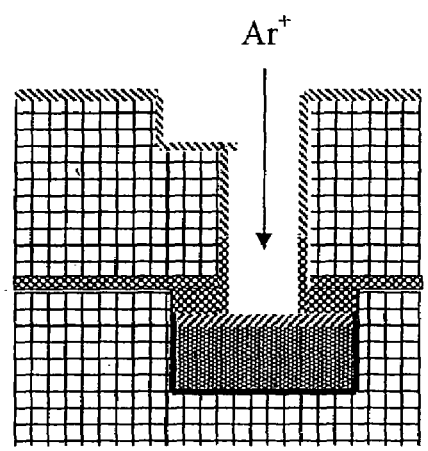
Figure 4E:
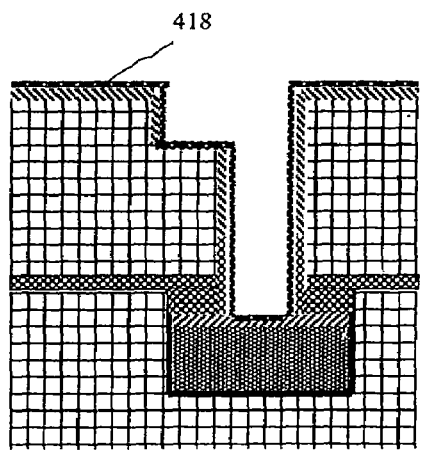

In another embodiment, the method of the invention can be adapted to provide an interconnect structure with a recessed structure as shown in FIGS. 4A to 4E. As shown in FIG. 4A, conductive line 411 and cap layer 412 are recessed in the dielectric trench. A portion of sacrificial layer 413 is also recessed in the dielectric trench. The interlayer dielectric 414 is deposited on sacrificial layer 413 and patterned to provide trench 415 and via 416 as shown in FIG. 4B. A barrier layer 417 is then deposited on the patterned interlayer dielectric as shown in FIG. 4C. As shown, there is poor or non-conformal coverage on the lower sidewalls proximate to the bottom of the via. A gaseous ion bombardment sputtering process is then used to etch or remove portions of barrier layer 417, sacrificial layer 413 at bottom of via 416 as shown in FIG. 4D. It's optional to remove the portion of cap layer 412 at bottom of via 416 if the cap layer 412 is a conductive material. If the cap layer 412 is not a good conductive material, however, it's required to remove the portion of cap layer 412 at bottom of via 416 in order to have good electrical contact between via 416 and underneath conductive line 411. Note that the re-sputtering of the sacrificial liner material onto the bottom of the side walls enhances the liner coverage at sites, which prior to the resputtering process, exhibited poor coverage of barrier layer 417. The method can also include the deposition of a metal liner or seed layer 418 prior to plating the copper conductive layer as shown in 4E.

Figure 5A:
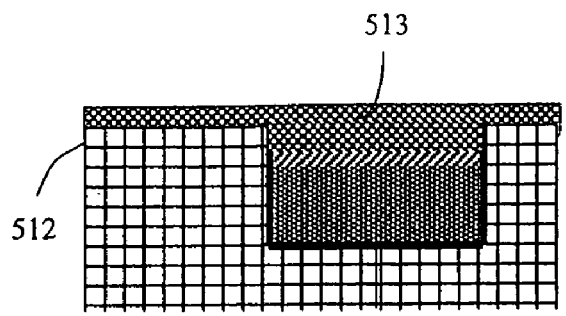
FIGS. 5A to 5F are representational cross-sectional views of process steps of another embodiment of the present invention
Figure 5B:
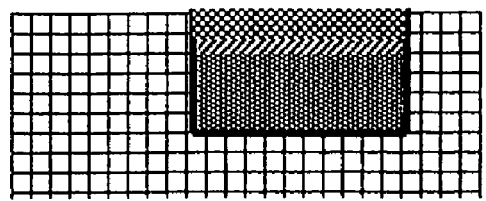

In another embodiment, the method of the invention can be adapted to provide an interconnect structure with a recessed structure as shown in FIGS. 5A to 5E. As shown in FIG. 5A, conductive line 511 and cap layer 512 are recessed in the dielectric trench. A portion of sacrificial layer 513 is also recessed in the dielectric trench. The top portion of sacrificial layer 513 is then planarized to a top surface of the dielectric, as shown in 5B. One skilled in the art would typically use a chemical mechanical polishing (CMP) process to remove the sacrificial layer 513 present on the top surface of the dielectric to provide a planarized structure having the sacrificial layer 513 flush with the top surface of the dielectric. In contrast to the above two described embodiments, i.e. FIG. 3 and FIG. 4, wherein the sacrificial layer materials, 313 and 413 respectively, are restricted to insulators, the sacrificial layer 513 in this embodiment can be conductor, insulator, or even semiconductor.

Figure 5C:
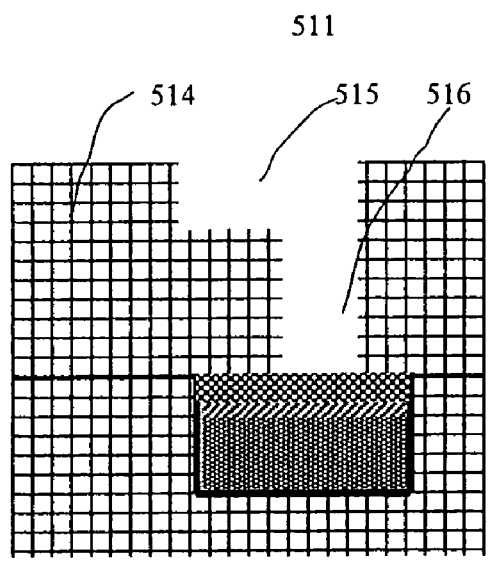
Figure 5D:
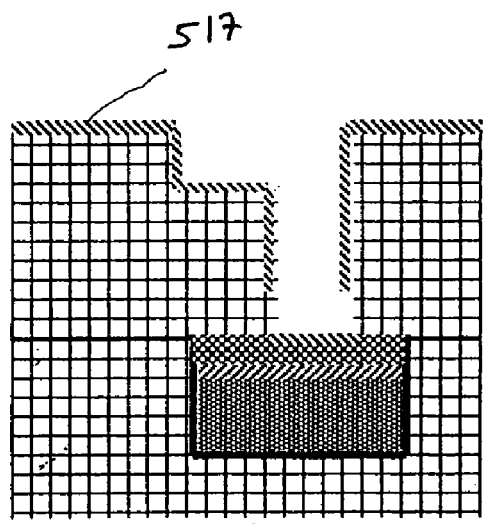
Figure 5E:
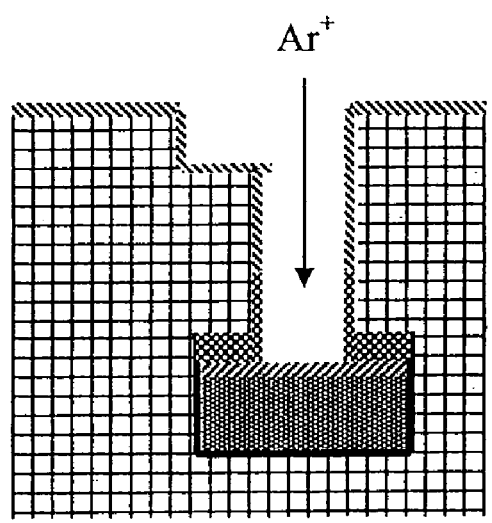
Figure 5F:
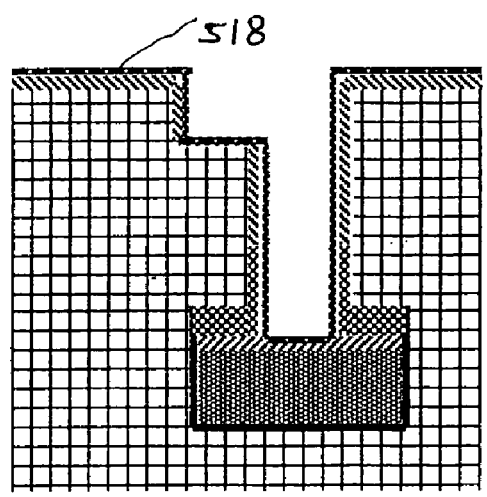

The interlayer dielectric 514 is then deposited on sacrificial layer 513 as well as on the dielectric layer. In this process, interlayer dielectric 514 would come in contact the dielectric. The interlayer dielectric 514 is patterned to provide trench 515 and via 516 as shown in FIG. 5C. A barrier layer 517 is then deposited on the patterned interlayer dielectric as shown in FIG. 5D. As shown, there is poor or non-conformal coverage on the lower sidewalls proximate to the bottom of the via. In FIG. 5E, a gaseous ion bombardment sputtering process is then used to etch or remove portions of barrier layer 517, sacrificial layer 513 and cap layer 512 at bottom of via 516 if the cap layer 512 is not a conductive material. When both the cap layer 512 and the sacrificial layer 513 are conductive materials, it's optional to remove the portion of the two materials, i.e. 512 and 513, at bottom of via 516. In another case in which the cap layer 512 is a conductive material, but the sacrificial layer 513 is not, it's necessary to remove portion of the sacrificial layer 513 at bottom of via 516, but not required for the cap layer 512. Note in all the three cases that the re-sputtering of the sacrificial liner material onto the bottom of the side walls enhance the liner coverage at sites, which prior to the resputtering process, exhibited poor coverage of barrier layer 517. The method can also include the deposition of a metal liner or seed layer 518 prior to plating the copper conductive layer as shown in 5F.

The invention is directed to an interconnect structure comprising: a conductive line in a bottom dielectric trench, wherein the conductive line is in contact with a cap layer; a sacrificial liner on the cap layer; and an interlayer dielectric with a via provided over the conductive line, wherein the lower sidewalls of the via contain removed portions of the sacrificial layer and cap layer. The interconnect structure can also include a barrier layer on the upper sidewalls of the via. The interconnect structure can also include a metal liner or a seed layer deposited on the barrier layer and the removed portions of the sacrificial layer. A conductive metal or an alloy thereof is then deposited within the via of the interlayer dielectric.

Many different materials can be used as the sacrificial layer. For example, the sacrificial layer can be a conductive material, an insulator material, or even a semiconductor, and include materials such as polymeric materials, dielectric materials and metals or metal alloys. Preferred dielectric materials that can be used as a sacrificial layer include silicon oxides, silicon nitrides and silicon carbides. Preferred metals and metal alloys that can be used as a sacrificial layer include tantalum nitride, tantalum, titanium silicon nitride, titanium, tungsten nitride and tungsten. Preferred polymeric materials that can be used as a sacrificial layer include tetrafluoro-poly-p-xylylene, poly(arylene ethers) and cyclotene. Preferred semiconductor materials that can be used as a sacrificial layer include Si, Ge, GaAs, InP, and ZnSe.

The interconnect structure of the invention can include a structure in which the cap layer extends beyond the conductive line as shown in FIGS. 3A to 3D. As shown, the interconnect structure includes a sacrificial layer and a cap layer that are disposed between the interlayer dielectric and the dielectric.

Alternatively, the interconnect structure can include a structure in which the cap layer is recessed within the trench as shown in FIGS. 4A to 4E and FIGS. 5A to 5E. FIGS. 4A to 4E depicts the sacrificial layer disposed between the interlayer dielectric and the dielectric. Whereas FIGS. 5A to 5E depicts how the sacrificial layer can be recessed in the dielectric trench. In this later embodiment, the interlayer dielectric contacts the dielectric, as shown.

The cap layer of the invention can include materials common for such an application known to those of skill in the art. For example, NiP or CoP materials can be used. More recently, CoWP has been used to as a capping layer for copper. CoWP can be deposited by an electroless process as well as by electrodeposition. Electrodeposited CoWP is described in a U.S. patent application, filed Nov. 18, 2003, which is assigned to International Business Machines, the entire disclosures of which is incorporated herein by reference.

A preferred barrier layer of the invention is described in U.S. patent application Ser. No. 10/132,173, filed Apr. 26, 2002, and Ser. No. 10/279,057, filed Oct. 24, 2002, both of which are assigned to International Business Machines, the entire disclosures of which are incorporated herein by reference.

The dielectric layers used to provide the interconnect structures of the invention can be any suitable dielectric layer used in the semiconductor manufacturing industry such as an oxide, e.g., silicon dioxide, nitride, silicon nitride, or an oxynitride layer. Low-k dielectric materials, e.g., SiLK® from Dow Chemical, Coral® from Novellus, Black Diamond® from Applied Materials and spin-on silicon-based dielectrics, can also be used. The Coral® can be described generically as a SiCOH dielectric. The dielectric layer can be formed by any of various methods, including by chemical svapor deposition and spin-on techniques. Dielectric materials described in U.S. Pat. No. 6,147,009, which issued Nov. 14, 2000, and U.S. Pat. No. 6,441,491, which issued on Aug. 27, 2002, the entire disclosures of which are incorporated herein by reference, and both of which are assigned to International Business Machines, can also be used to form the interconnect structures of the invention.

We claim:

1. A method of making an interconnect structure comprising:
providing an interconnect copper line in a dielectric trench wherein the interconnect copper line is in contact with a cap layer;
depositing a sacrificial layer on the cap layer;
depositing an interlayer dielectric on the sacrificial layer;
forming a trench and a via in the interlayer dielectric, wherein the via bottom extends to the sacrificial layer; and removing a portion of the cap layer and the sacrificial layer proximate to the bottom surface of the via, wherein the removed portions of the cap layer and the sacrificial layer deposit predominantly along the lower sidewalls of the via.

2. The method of claim 1 further comprising depositing a baffler layer on upper and lower sidewalls and bottom surface of the trench and via in the interlayer dielectric.

3. The method of claim 2 further comprising removing a portion of the barrier layer at the bottom surface of the via, wherein the removed portions of the barrier layer deposit predominantly along the lower sidewalls of the via.

4. The method of claim 2 further comprising depositing a metal liner or a seed layer in contact with the barrier layer.

5. The method of claim 1 wherein removing a portion of the cap layer and the sacrificial layer is conducted by gaseous ion bombardment.

6. The method of claim 1 wherein the sacrificial layer is a material selected from the group consisting of silicon oxides, silicon nitrides, silicon carbides, tetrafluoro-poly-p-xylylene, poly(arylene ethers) and cyclotene.

7. The method of claim 1 wherein the sacrificial layer is a material selected from the group consisting of tantalum nitride, tantalum, titanium silicon nitride, titanium, tungsten nitride and tungsten.

8. The method of claim 1 wherein the provided interconnect copper line and the cap layer are recessed in the dielectric trench.

9. The method of claim 8 wherein the sacrificial layer is recessed in the dielectric trench.

10. The method of claim 9 further comprising planarizing the sacrificial layer to a top surface of the dielectric trench.

11. A method of making an interconnect structure comprising:
  providing an interconnect conductive line in a dielectric trench, wherein the conductive line is in contact with a cap layer, and the conductive line and the cap layer are recessed in the dielectric trench;
  depositing a sacrificial layer on the cap layer;
  depositing an interlayer dielectric on the sacrificial layer;
  forming a trench and a via in the interlayer dielectric, wherein the via bottom extends to the sacrificial layer; and
  removing a portion of the cap layer and the sacrificial layer proximate to the bottom surface of the via, wherein the removed portions of the cap layer and the sacrificial layer deposit predominantly along the lower sidewalls of the via.

12. The method of claim 11 wherein the sacrificial layer is recessed in the dielectric trench.

13. The method of claim 11 further comprising depositing a barrier layer on upper and lower sidewalls and bottom surface of the trench and via in the interlayer dielectric.

14. The method of claim 13 further comprising depositing a metal liner or a seed layer in contact with the barrier layer.

15. The method of claim 11 wherein removing a portion of the cap layer and the sacrificial layer is conducted by gaseous ion bombardment.

16. The method of claim 11 further comprising planarizing the sacrificial layer to a top surface of the dielectric trench.

* * * * *